(12) United States Patent
Monfarad

(10) Patent No.: US 6,741,469 B1
(45) Date of Patent: May 25, 2004

(54) REFRIGERATION COOLING ASSISTED MEMS-BASED MICRO-CHANNEL COOLING SYSTEM

(75) Inventor: Ali Heydari Monfarad, Albany, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/360,345

(22) Filed: Feb. 7, 2003

(51) Int. Cl.$^7$ .................................................. H05K 7/20
(52) U.S. Cl. ........................ 361/700; 361/698; 361/699; 257/714; 174/15.1; 174/15.2; 165/80.4; 165/104.26
(58) Field of Search ................................. 361/698, 699, 361/700, 709, 711; 257/714, 715, 716; 174/15.1, 15.2; 165/80.4, 104.21, 104.33; 62/259.2

(56) References Cited

U.S. PATENT DOCUMENTS

| | | | |
|---|---|---|---|
| 4,313,310 A | 2/1982 | Kobayashi et al. | 62/175 |
| 4,434,625 A | 3/1984 | Cree | 62/199 |
| 4,573,067 A | 2/1986 | Tuckerman et al. | 357/82 |
| 4,846,861 A | 7/1989 | Berry et al. | 62/6 |
| 5,365,749 A | 11/1994 | Porter | 62/259.2 |
| 5,693,991 A | 12/1997 | Hiterer et al. | 310/30 |
| 5,715,693 A | 2/1998 | van der Walt et al. | 62/198 |
| 5,763,951 A * | 6/1998 | Hamilton et al. | 257/714 |
| 5,884,690 A | 3/1999 | Lee et al. | 165/80.3 |
| 5,963,425 A | 10/1999 | Chrysler et al. | 361/695 |
| 5,993,178 A | 11/1999 | Park et al. | 417/545 |
| 6,034,872 A | 3/2000 | Chrysler et al. | 361/699 |
| 6,035,655 A | 3/2000 | Hare et al. | 62/259.2 |
| 6,038,874 A | 3/2000 | van der Walt et al. | 62/198 |
| 6,044,660 A | 4/2000 | Numoto et al. | 62/468 |
| 6,054,676 A | 4/2000 | Wall et al. | 219/209 |
| 6,079,960 A | 6/2000 | Funatsu et al. | 417/488 |
| 6,089,836 A | 7/2000 | Seo | 417/417 |
| 6,138,459 A | 10/2000 | Yatsuzuka et al. | 62/6 |
| 6,250,895 B1 | 6/2001 | Kawahara et al. | 417/363 |
| 6,279,337 B1 * | 8/2001 | Davidson et al. | 62/259.2 |
| 6,398,523 B1 | 6/2002 | Hur et al. | 417/417 |
| 6,437,981 B1 * | 8/2002 | Newton et al. | 361/700 |
| 6,591,625 B1 * | 7/2003 | Simon | 62/259.2 |
| 6,598,409 B2 * | 7/2003 | Shyy et al. | 62/115 |
| 2002/0130408 A1 * | 9/2002 | Pike et al. | 257/714 |

OTHER PUBLICATIONS

Goodson, K. "Herectic Current Projects Current Projects Index Electrokinetic Micro Coolers", pp. 1–2 [online]. Retrieved on Jun. 13, 2003. Retrieved from the Internet: <URL:http://www.darpa.mil/mto/heretic/projects/7.html>.

Koo, J.M., Jiang, L., Zhang, L., Zhou, P., Banerjee, S., Santiago, J.G., Kenny, T.W., and Goodson, K.E., 2001, "Modeling of Two–Phase Microchannel Heat Sinks for VLSI Chips", Proc. 14th IEEE Conference on MEMS 2001, Interlaken, Switzerland, Jan. 21–25, pp. 422–426.

"Thermal Engineering of Electronic Microstructures/Electrokinetically–Pumped Two–Phase Heat Exchangers" pp. 1–3 [online]. Retrieved on Apr. 24, 2003. Retrieved from the Internet: <URL:http://www.stanford.edu/group/microheat/hex.html>.

Cataldo, Anthony., "Startup puts cold water on hot CPUs", EE Times, pp. 1–3 [online]. Retrieved on Oct. 16, 2003. Retrieved from the Internet:<URL:http://www.eetimes.com/issue/semi/OEG20031006S0021>.

* cited by examiner

Primary Examiner—Boris Chervinsky
(74) Attorney, Agent, or Firm—Gunnison, McKay & Hodgson, L.L.P.; Lisa A. Norris

(57) ABSTRACT

A refrigeration cooling assisted MEMS-based microchannel cooling system that removes high heat densities generated by microelectronic components using a primary cooling system thermally coupled with a secondary chip embedded cooling system.

24 Claims, 7 Drawing Sheets

REFRIGERATION COOLING ASSISTED MEMS-BASED MICRO-CHANNEL COOLING SYSTEM

BACKGROUND OF THE INVENTION

1. Field of the Invention

The present invention is directed to the field of microelectronics, and more particularly, to heat dissipation in microelectronics.

2. Description of Related Art

Currently, demand for higher performing microprocessing devices is resulting in microelectronic components having increasing levels of power density and heat dissipation. As the reliability and lifespan of a microelectronic component is dependent on the operating temperature, removal of heat from microelectronic components has become one of the most important issues facing computer systems designers today.

Conventional thermal control schemes, such as heat sinks, air cooling with fans, thermoelectric cooling, heat pipes, and vapor chambers have either reached their practical application limit or are soon to become impractical for recently emerged microelectronic components. Current heat dissipation of values of 20 W to 50 W are estimated to increase to 100 W and even 200 W in the next five to ten years. Thus, the reliability of these microelectronic component systems will suffer if high temperatures are permitted to exist.

In an attempt to address the need for greater heat dissipation, one prior art technique utilized a microelectromechanical system (MEMS)-based-micro-channel cooling system embedded in the substrate of the microelectronic component as further described herein with reference to FIG. 1. FIG. 1 illustrates a functional diagram of an integrated circuit (IC) chip package 100 including a voltage-controlled, electrokinetic (EK) microcooler system 110 embedded in a substrate 114 on which an IC 112 is formed. EK microcooler system 110 removed dissipated heat from integrated circuit (IC) 112 utilizing a two-phase cooling loop having an electrokinetic (EK) pump 116.

In this prior art technique, liquid was circulated under high pressure (for example, 5 atm) in a closed loop at least part of which was in thermal contact with underlying IC 112. Heat exchangers, such as microchannels or microjets, transferred heat from IC 112 to an evaporator region 120 of the closed loop above IC 112 by thermally conductive contact with evaporator region 120. An example of a microchannel heat exchanger is described in U.S. Pat. No. 4,573,067 to Tuckerman et al. entitled "Method and Means for Improved Heat Removal in Compact Semiconductor Integrated Circuits" and hereby incorporated by reference in its entirety.

The circulated liquid absorbed the heat and evaporated in evaporator region 120. The vapor then traveled through the closed loop to a condenser region 118 of the closed loop that was lower in temperature than evaporator region 120. The vapor then condensed to liquid releasing the heat. The liquid was then pumped back to evaporator region 120 by EK pump 116 and the cooling cycle repeated.

Advantageously, EK microcooler system 110 had no solid moving parts and was implemented as part of the fabrication process of substrate 114 of IC 112, and was therefore expected to be more compact and reliable. The high liquid pressure enabled two-phase micro heat exchangers for greater heat dissipation, utilized very small amounts of voltage to control EK pump 116 and, therefore, had reduced power consumption.

Unfortunately, MEMS-based micro-channel heat exchanger systems that were embedded in the substrate of a central processor unit (CPU) or an application specific integrate circuit (ASIC) using the fabrication process for cooling of microelectronic components had thermal inertia, heat removal inefficiency and very large heat rejection to heat absorption areas. Consequently, these systems provided little more heat dissipation than earlier, less costly heat dissipation techniques preventing their widespread application in the electronic industry.

SUMMARY OF THE INVENTION

According to the invention, a refrigeration cooling assisted MEMS-based micro-channel cooling system removes high heat densities by direct spot-cooling of electronic components using a primary cooling system thermally coupled with a secondary chip embedded cooling system. The invention maintains low levels of energy consumption with acceptable component sizes. The invention provides highly efficient chip embedded cooling with continuous or intermittent operation of the primary cooling system.

In one embodiment, the refrigeration cooling assisted MEMS-based micro-channel cooling system includes: a primary cooling system, such as a multiple compressor refrigeration heat sink module; at least one integrated circuit (IC) chip embedded secondary cooling system, such as a MEMS-based micro-channel cooling system; and at least one socket thermally coupling the primary and secondary cooling systems.

In one embodiment, a portion of an evaporator line from the primary cooling system is extended to the socket and is positioned in thermally conductive contact with the socket. When the IC chip embedded secondary cooling system is positioned in thermally conductive contact with the socket, heat generated by the integrated circuit is initially removed by the IC chip embedded secondary cooling system, and dissipated into the socket. The heat is then transferred from the socket to the evaporator line. The evaporator line, e.g., refrigerant circulating within the evaporator line, transfers the dissipated heat away from the socket to the primary cooling system for further dissipation.

By continually, or intermittently, removing heat transferred from the IC chip embedded secondary cooling system through the socket to the primary cooling system, the thermal inertia and heat rejection areas experienced in the prior art MEMS-based micro-channel cooling systems are significantly reduced allowing for higher heat dissipation levels.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention, and together with the description, serve to explain the principles of the invention. In the drawings, the same reference numbers are used to denote similar components in the various embodiments.

In the drawings.

DETAILED DESCRIPTION

The invention will now be described in reference to the accompanying drawings. The same reference numbers may be used throughout the drawings and the following description to refer to the same or like parts.

In accordance with the invention, a refrigeration cooling assisted MEMS-based micro-channel cooling system removes high heat densities by direct spot-cooling of electronic components while maintaining low levels of energy consumption with acceptable component sizes. In one embodiment, the refrigeration cooling assisted MEMS-based micro-channel cooling system includes a primary cooling system, at least one IC chip embedded secondary cooling system, and at least one socket for transferring heat dissipated by the IC chip embedded secondary cooling system to the primary cooling system.

By continually, or intermittently, transferring heat dissipated by the IC chip embedded secondary cooling system through the socket to the primary cooling system, the thermal inertia and heat rejection areas experienced in the prior art MEMS-based cooling systems are significantly reduced allowing for higher heat dissipation levels.

In some instances, higher heat dissipation levels can potentially permit use of MEMS devices having lower pressures resulting in less strain and/or failure rates than those experienced with high pressure MEMS devices.

Although the present invention is described herein primarily with reference to transfer of heat dissipated by the IC chip embedded secondary cooling system through the socket to the primary cooling system, it can be understood by those of skill in the art that other heat generated by the IC chip can also be transferred via the socket to the primary cooling system. Consequently, the present invention assists in removing heat transferred from the entire IC chip even though the heat may not be transferred to the socket through the IC chip embedded secondary cooling system.

Figure 2:
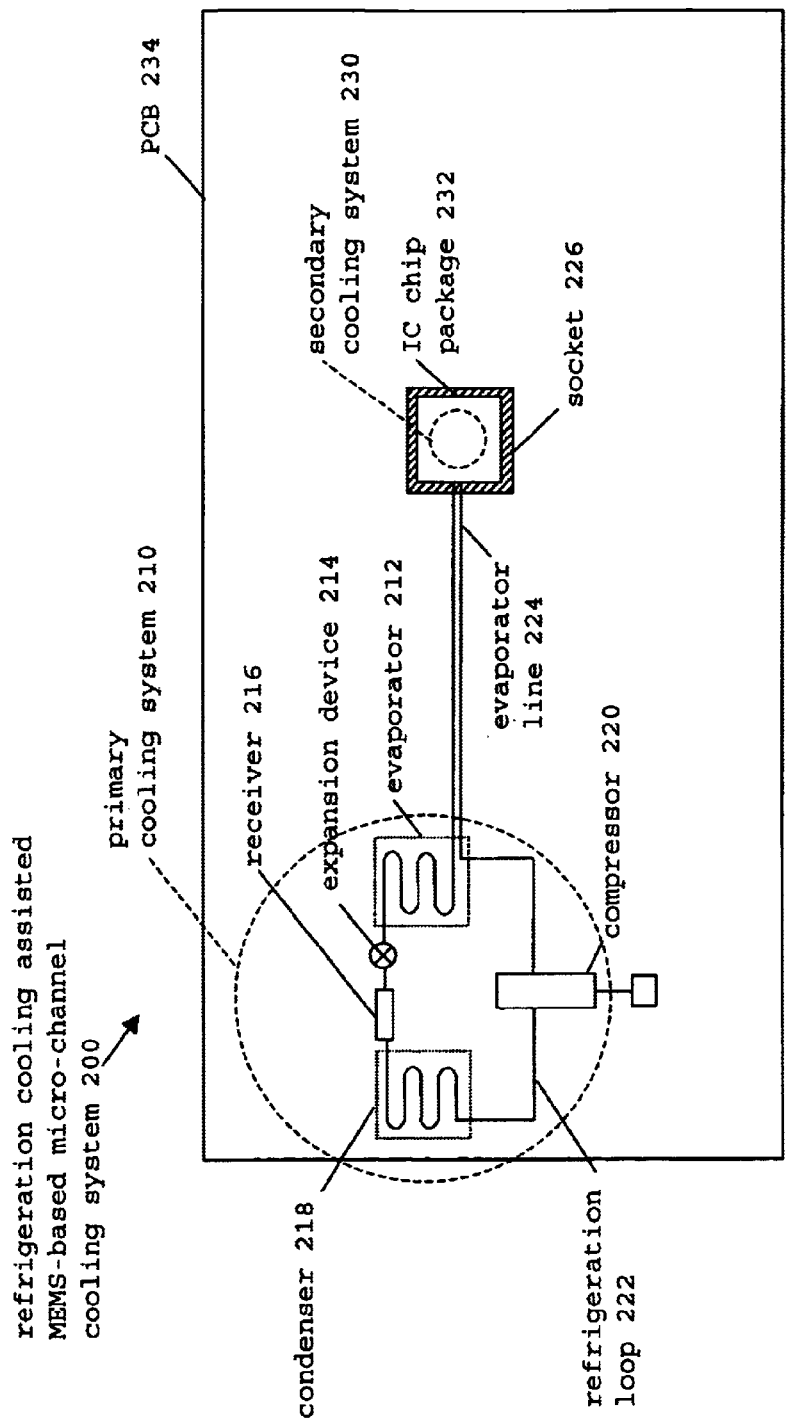
FIG. 2 illustrates a functional diagram of a refrigeration cooling assisted MEMS-based micro-channel cooling system 200 in accordance with one embodiment of the invention.

FIG. 2 illustrates a functional diagram of a refrigeration cooling assisted MEMS-based micro-channel cooling system 200 in accordance with one embodiment of the invention. Referring to FIG. 2, in one embodiment, refrigeration cooling assisted MEMS-based micro-channel cooling system 200 includes at least: a primary cooling system 210; a secondary cooling system 230 embedded in an IC chip package 232; and, a socket 226 thermally coupling primary cooling system 210 to secondary cooling system 230 when IC chip package 232 is positioned in socket 226 such that secondary cooling system 230 is in thermally conductive contact with socket 226.

In one embodiment, primary cooling system 210 is a vapor compression cooling system and includes: an evaporator 212, an expansion device 214, an optional receiver 216, a condenser 218 and a compressor 220, all connected by a refrigeration loop 222 through which a refrigerant, such as R134, is circulated. Evaporator line 224 is an extension of evaporator 212 and is located in thermally conductive contact with socket 226.

In one embodiment, primary cooling system 210 is a field replaceable packaged refrigeration heat sink module as described in U.S. patent application Ser. No. 10/206,570 entitled "Multiple Compressor Refrigeration Heat Sink Module for Cooling Electronic Components" of Ali Heydari Monfarad filed Jul. 26, 2002 and hereby incorporated by reference in its entirety.

Figure 1:
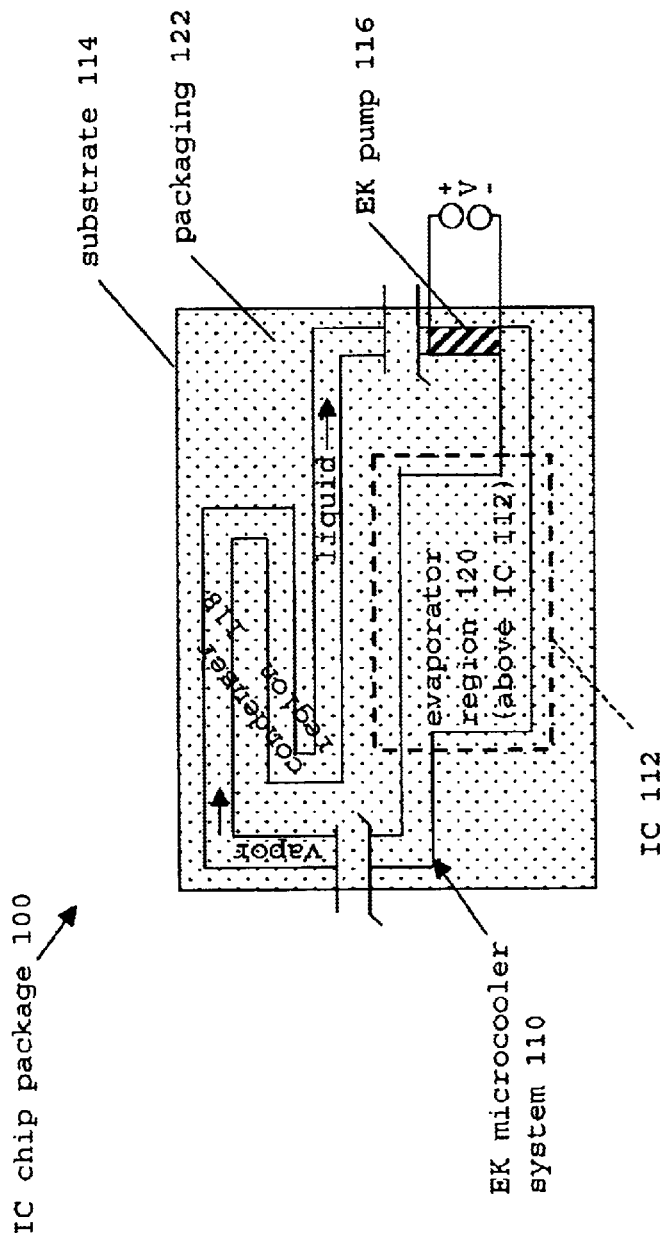
FIG. 1 illustrates a functional diagram of an integrated circuit (IC) chip package 100 including a voltage-controlled, electrokinetic (EK) microcooler system 110, e.g., a MEMS-based cooling system, embedded in a substrate 114.

In one embodiment, secondary cooling system 230 is a MEMS-based micro-channel cooling system embedded in IC chip package 232, such as EK microcooler system 110 earlier described with reference to FIG. 1. However, in other embodiments, other MEMS-based cooling systems that can be placed in thermally conductive contact with socket 226 can also be used.

In one embodiment, IC chip package 232 can include a single IC chip, or can include more than one IC chip, such as a multi-chip module (MCM). In one embodiment, socket 226 is formed of a thermally conductive material that permits heat transfer from secondary cooling system 230 to primary cooling system 210. For example, in one embodiment, the thermally conductive material is a thermally conductive metal, such as aluminum, copper, and gold, or other thermally conductive materials, such as ceramics.

In other embodiments, more than one thermally conductive material can be used so long as the materials permit heat transfer from secondary cooling system 230 to primary cooling system 210. For example, one or more thermally conductive metals can be used to form the thermally conductive material.

In still other embodiments, thermally conductive and non-thermally conductive materials can be used to form socket 226 so long as the thermally conductive material is located to permit efficient heat transfer from secondary cooling system 230 to primary cooling system 210. Examples of thermal contact between socket 226 and primary cooling system 210 are further described herein with reference to FIGS. 6 and 7.

Figure 3:
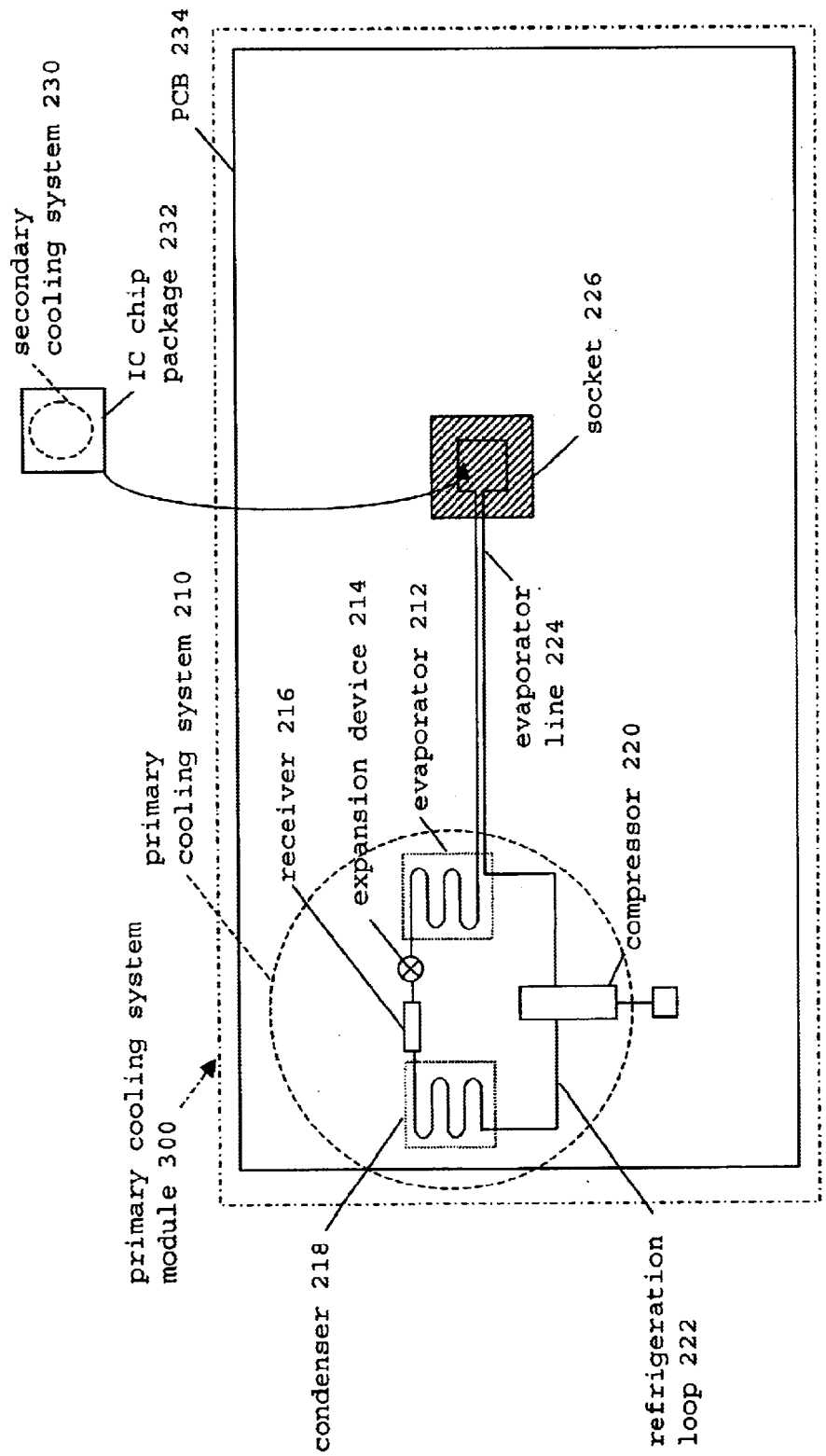
FIG. 3 illustrates a functional diagram of the refrigeration cooling assisted MEMS-based micro-channel cooling system 200 prior to positioning of IC chip package 232 in socket 226 in accordance with one embodiment of the invention.

FIG. 3 illustrates a functional diagram of the refrigeration cooling assisted MEMS-based micro-channel cooling system 200 prior to positioning of IC chip package 232 in socket 226 in accordance with one embodiment of the invention. Referring to FIGS. 2 and 3 together, in one embodiment of the invention, primary cooling system 210 (including evaporator line 224) is positioned on a PCB board 234 together with socket 226 to form a primary cooling system module 300. This enables primary cooling system module 300 to be fabricated independent of IC chip package 232 and stored until needed, if so desired. Thus, in the present embodiment, primary cooling system module 300 includes at least: primary cooling system 210 (including evaporator line 224); and, socket 226 in thermally conductive contact with evaporator line 224.

In other embodiments, primary cooling system module 300 can be fabricated independent of socket 226 and stored until needed, if so desired. This enables flexibility in the selection of varying socket materials for use in socket 226, such as when socket material selection is dependent upon a particular environment or IC chip package 232 and/or secondary cooling system 230.

IC chip package 232, including secondary cooling system 230, is positioned in socket 226 so that secondary cooling system 230 is in thermally conductive contact with socket 226 to enable heat dissipation from secondary cooling system 230 to primary cooling system 210 through socket 226. In one embodiment, primary cooling system 210 and IC chip package 232, including secondary cooling system 230, are connected to a power source or sources (not shown) to enable their operation.

Heat generated by the IC chip (not shown) within IC chip package 232 is dissipated to secondary cooling system 230. Secondary cooling system 230 dissipates the heat through thermally conductive contact with socket 226 to evaporator line 224 for additional dissipation by primary cooling system 210.

In one embodiment, compressor 220 of primary cooling system 210 compresses the refrigerant (not shown) into a high-pressure, high temperature liquid that is then conveyed to condenser 218. At condenser 218, the refrigerant is allowed to cool before being conveyed to receiver 216. From receiver 216, the refrigerant passes through expansion device 214, such as a capillary tube, and into evaporator 212. The liquid refrigerant evaporates in evaporator 212 (including evaporator line 224) and in the process absorbs heat from socket 226 to produce a cooling effect in socket 226. From evaporator 212, the refrigerant is drawn back into compressor 220 to begin another cycle through refrigeration loop 222.

Thus, utilizing MEMS-based micro-channel cooling system 200, heat generated by IC chip package 232 is initially cooled by secondary cooling system 230. Heat from secondary cooling system 230 is then transferred via socket 226 to primary cooling system 210.

Figure 4:
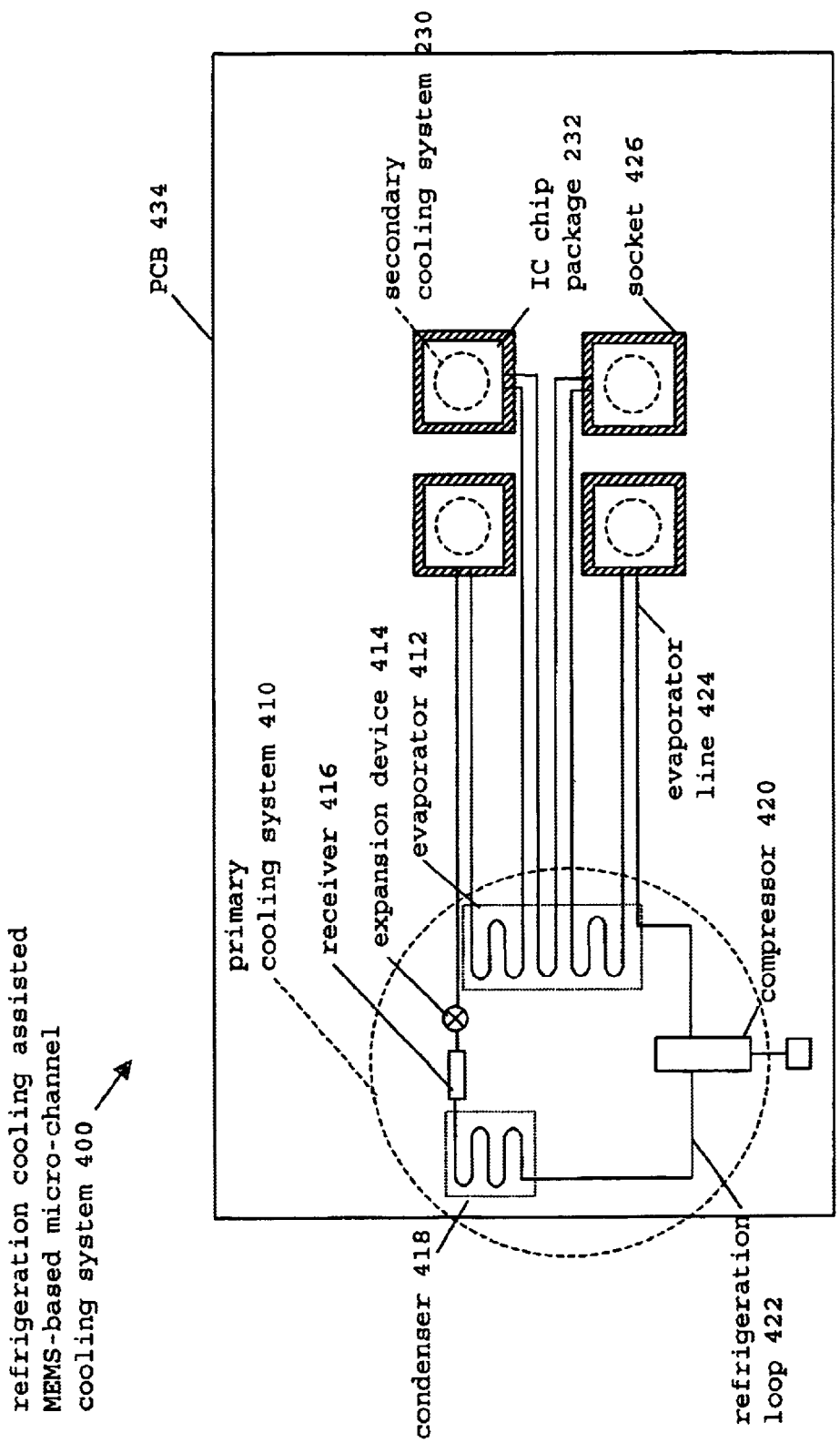
FIG. 4 illustrates a functional diagram of a refrigeration cooling assisted MEMS-based micro-channel cooling system 400 in accordance with one embodiment of the invention.
Figure 5:
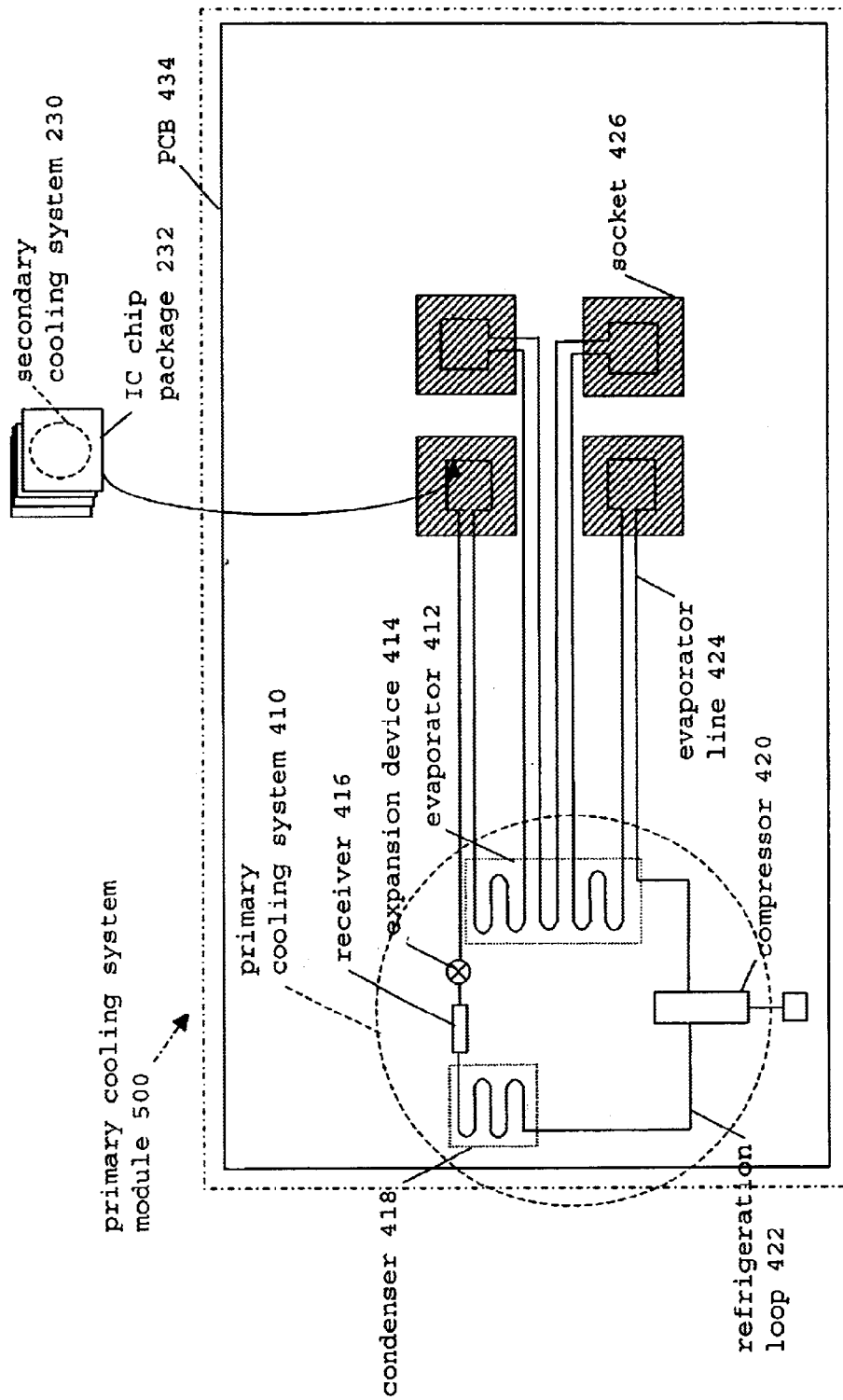
FIG. 5 illustrates a functional diagram of the refrigeration cooling assisted MEMS-based micro-channel cooling system 400 prior to positioning of IC chip package 232 in socket 426 in accordance with one embodiment of the invention.

In some circuit designs, it may be desirable to dissipate heat from more than one secondary cooling system 230 to primary cooling system 210. FIGS. 4 and 5 further describe herein another embodiment of the invention for dissipating heat from multiple secondary cooling systems 230.

Although the following embodiment is described herein primarily with reference to transfer of heat dissipated by multiple IC chip embedded secondary cooling systems through the sockets to the primary cooling system, it can be understood by those of skill in the art that other heat generated by multiple IC chips can also be transferred via the sockets to the primary cooling system. Consequently, the present invention assists in removing heat transferred from multiple IC chips even though the heat may not be transferred to the sockets through the IC chip embedded secondary cooling systems.

FIG. 4 illustrates a functional diagram of a refrigeration cooling assisted MEMS-based micro-channel cooling system 400 in accordance with one embodiment of the invention. Referring to FIG. 4, in one embodiment, refrigeration cooling assisted MEMS-based micro-channel cooling system 400 includes at least: a primary cooling system 410 (including a plurality of evaporator lines 424); a plurality of secondary cooling systems 230 embedded in associated ones of a plurality of IC chip packages 232; and, a plurality of sockets 426, each socket 426 thermally coupling primary cooling system 410 to a secondary cooling system 230 of an associated IC chip package 232 when the associated IC chip package 232 is positioned in socket 426 such that secondary cooling system 430 is in thermally conductive contact with socket 426.

In one embodiment, primary cooling system 410, including evaporator lines 424, and sockets 426 are located on a printed circuit board (PCB) 434, and each of IC chip packages 232, including secondary cooling systems 230, is placed in thermal contact with a different socket 426. In one embodiment, primary cooling system 410 and IC chip packages 232, including secondary cooling systems 230, are connected to a power source or sources (not shown) to enable their operation.

In one embodiment, primary cooling system 410 is a vapor compression cooling system and further includes: an evaporator 412, an expansion device 414, an optional receiver 416, a condenser 418, and a compressor 420, all connected by a refrigeration loop 422 through which a refrigerant, such as R134, is circulated. Evaporator lines 424 are an extension of evaporator 412 and are located in thermally conductive contact with socket 426.

In one embodiment, primary cooling system 410 is a field replaceable packaged refrigeration heat sink module as described in U.S. patent application Ser. No. 10/206,570 entitled "Multiple Compressor Refrigeration Heat Sink Module for Cooling Electronic Components" of Ali Heydari Monfared filed Jul. 26, 2002, earlier incorporated by reference in its entirety.

In one embodiment, secondary cooling system 230 is a MEMS-based micro-channel cooling system embedded in IC chip package 232, such as EK microcooler system 110 earlier described with reference to FIG. 1. However, in other embodiments, other MEMS-based cooling systems that can be placed in thermally conductive contact with socket 426 can also be used.

In one embodiment, IC chip package 232 can include a single IC chip, or can include more than one IC chip, such as a multi-chip module (MCM). In one embodiment, socket 426 is formed of a thermally conductive material as earlier described with reference to FIGS. 2 and 3 to enable heat transfer from secondary cooling system 230 to evaporator line 424 of primary cooling system 410, e.g., to the refrigerant circulating in evaporator line 424. Examples of thermal contact between socket 426 and evaporator line 424, in accordance with the invention, are further described herein with reference to FIGS. 6 and 7.

FIG. 5 illustrates a schematic diagram of the refrigeration cooling assisted MEMS-based micro-channel cooling system 400 prior to positioning of IC chip package 232 in socket 426 in accordance with one embodiment of the invention. Referring to FIGS. 4 and 5 together, in one embodiment of the invention, primary cooling system 410 (including evaporator lines 424) are positioned on PCB board 434 together with sockets 426 to form a primary cooling system module 500. This enables primary cooling system module 500 to be fabricated independent of IC chip package 232 and stored until needed, if so desired. Thus, in the present embodiment, primary cooling system module 500 includes at least: primary cooling system 410 (including evaporator lines 424); and, sockets 426 in thermally conductive contact with evaporator lines 424.

In other embodiments, primary cooling system module 500 can be fabricated independent of sockets 426 and stored until needed, if so desired. This enables flexibility in the selection of varying socket materials for use in sockets 426, such as when socket material selection is dependent upon a particular environment or IC chip package 232 and/or secondary cooling system 230.

IC chip packages 232 are positioned in sockets 426 so that secondary cooling systems 230 are in thermal contact with sockets 426 to enable heat dissipation from secondary cooling systems 230 to sockets 426. Thus, although FIG. 5 illustrates a placement pattern (indicated by the arrow) for one of IC chip packages 232, the remaining IC chip packages 232 are placed in open sockets 426.

Heat generated by the IC chips (not shown) within each of IC chip packages 232 is dissipated to secondary cooling systems 230. Secondary cooling systems 230 dissipate the heat through thermally conductive contact with sockets 426 to evaporator lines 424 for additional dissipation by primary cooling system 410.

In one embodiment, primary cooling system 410 operates similar to primary cooling system 210 of FIGS. 2 and 3 earlier described.

Thus, utilizing MEMS-based micro-channel cooling system 400, heat generated by IC chip packages 232 is initially cooled by associated secondary cooling systems 230. Heat dissipated from secondary cooling systems 230 is removed to primary cooling system 410 via sockets 426.

As earlier described, referring to FIGS, 2, 3, 4 and 5, socket 226 enables transfer of heat dissipated from secondary cooling system 230 to primary cooling system 210 via evaporator line 224. Similarly, sockets 426 enable transfer of heat dissipated from secondary cooling systems 230 to primary cooling system 410 via evaporator lines 424 of primary cooling system 410. In accordance with the invention, there are numerous ways evaporator lines 224 and 424 can be positioned in thermal contact with sockets 226 and 426 to enable efficient thermal coupling as further described herein with reference to FIGS. 6 and 7.

Figure 6:
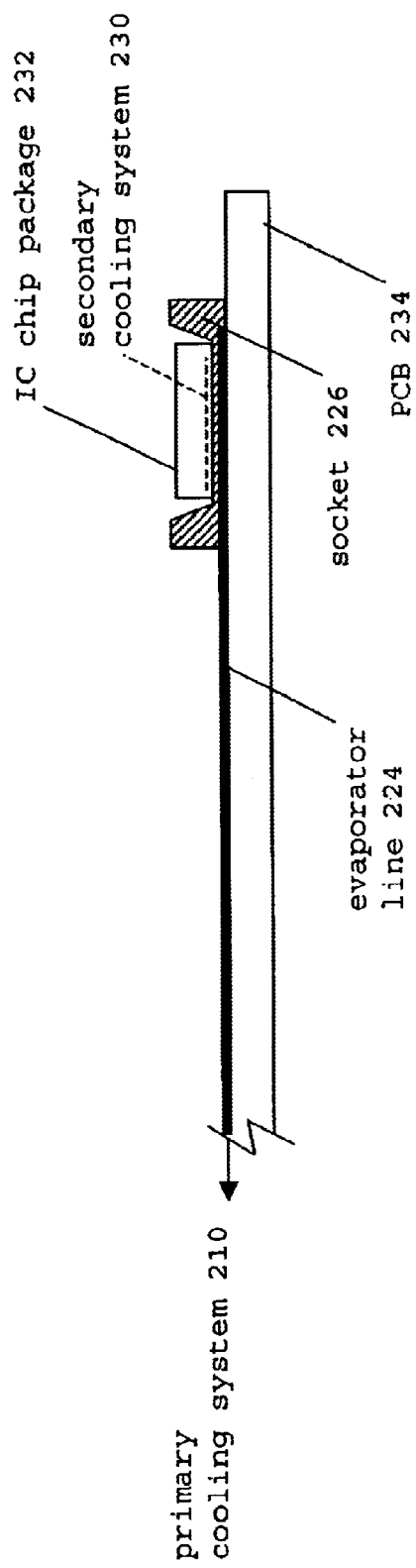
FIG. 6 is a longitudinal cross-sectional representation of an exemplary evaporator line and socket arrangement that can be used in the refrigeration cooling assisted MEMS-based micro-channel cooling systems depicted in FIGS. 2 and 4 or in the primary cooling modules depicted in FIGS. 3 and 5 according to one embodiment of the invention.

FIG. 6 is a longitudinal cross-sectional representation of an exemplary evaporator line and socket arrangement according to one embodiment of the invention. The present embodiment is described with reference to refrigeration cooling assisted MEMS-based micro-channel cooling system 200 (FIG. 2), however, the present embodiment can also be implemented in refrigeration cooling assisted MEMS-based micro-channel cooling system 400 (FIG. 4) or in primary cooling modules 300 (FIG. 3) and 500 (FIG. 5).

Referring to FIG. 6, in one embodiment, evaporator line 224 is formed on or in PCB 234 so that it underlies socket 226. This enables application of socket 226 independent of primary cooling module 300 (FIG. 3). However, in other embodiments, evaporator line 224 can be formed on or in PCB 234 so that it is part of socket 226.

IC chip package 232 is positioned in socket 226 so that secondary cooling system 230 is in thermally conductive contact with socket 226. In the present embodiment, IC chip package 232 (including secondary cooling system 230) does not directly contact evaporator line 224, but rather dissipates heat to evaporator line 224 through thermally conductive socket 226. As earlier discussed with reference to FIGS. 2 and 3, refrigerant circulating in evaporator line 224 removes the dissipated heat to primary cooling system 210.

In the present embodiment, separation of IC chip package 232 from direct contact with evaporator line 224 enables IC package 232 to be removed from socket 226, such as in the case of failure of either IC chip package 232 or primary cooling module 300. However, in other embodiments, arrangements can be designed allowing direct contact of IC package 232 with evaporator line 224, however, separation of IC chip package 232 may not be accomplished as efficiently.

In FIGS. 2, 3, 4, and 5, evaporator line 224 and evaporator lines 424 are depicted encircling an area beneath where IC chip packages 232 are (will be) positioned to provide thermally conductive contact with socket 226 or sockets 426. In other embodiments, in accordance with the invention, evaporator line 224 and evaporator lines 424 can be differently arranged to establish thermally conductive contact with socket 226 or sockets 426, respectively, to provide effective patterns of heat transfer relative to the particular heat dissipation patterns of IC chip package 232.

Figure 7:
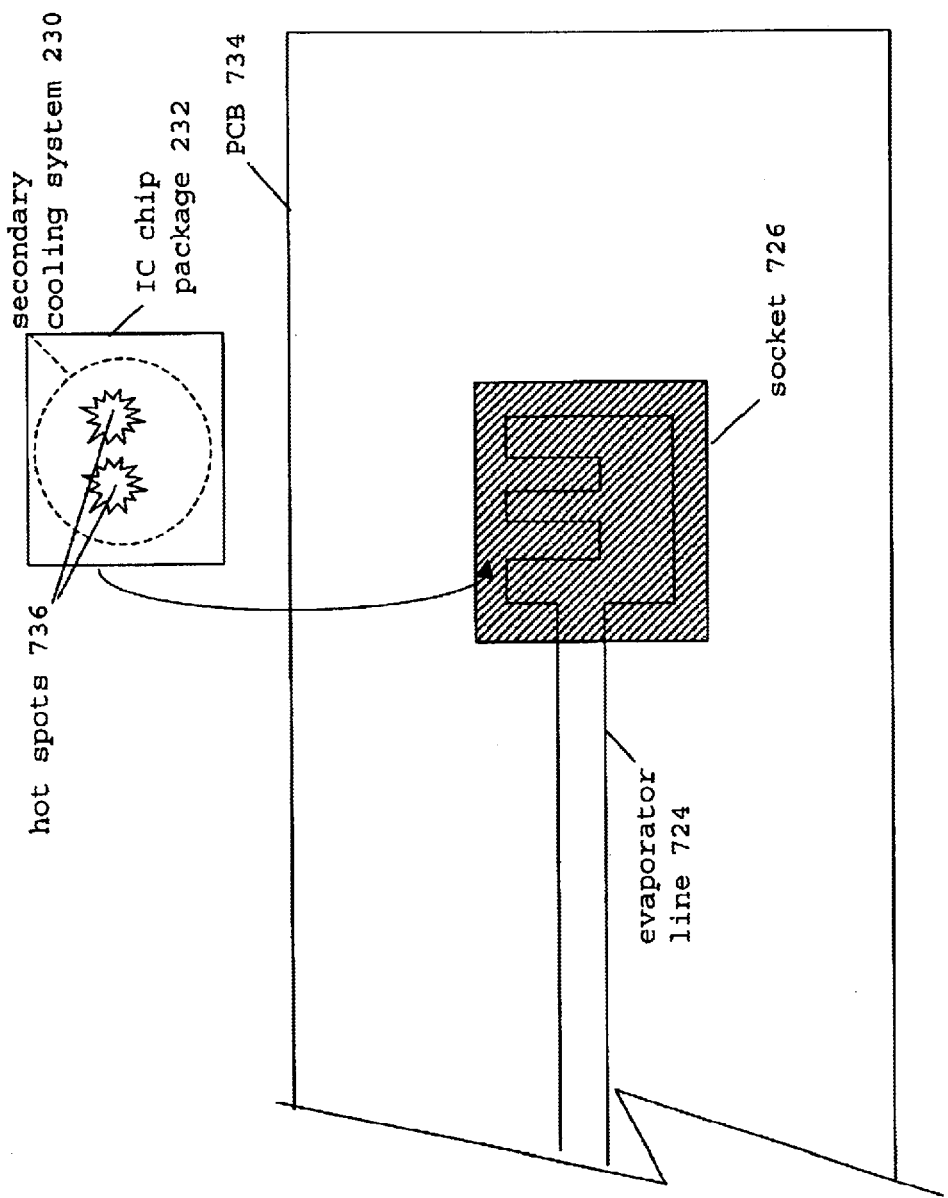
FIG. 7 illustrates a functional diagram of a serpentine evaporator line arrangement for use in providing thermally conductive contact with a socket according to one embodiment of the invention.

FIG. 7 illustrates a functional diagram of a serpentine evaporator line arrangement for use in providing thermally conductive contact with a socket according to one embodiment of the invention. The present embodiment can be implemented in refrigeration cooling assisted MEMS-based micro-channel cooling systems 200 (FIG. 2) and 400 (FIG. 4) or in primary cooling modules 300 (FIG. 3) and 500 (FIG. 5).

In FIG. 7, in one embodiment, a portion of an evaporator line 724 from a primary cooling system (not shown), such as primary cooling system 210 or 410, is serpentined under or within a socket 726 on a PCB 734 to provide greater heat transfer area to selected areas of IC chip package 232 and/or secondary cooling system 230. For example, assume secondary cooling system 230 dissipates heat from IC chip package 232, having localized hot spots 736. As shown in FIG. 7, evaporator line 724 is serpentined to provide greater thermally conductive contact area with socket 726 in areas where hot spots 736 would be located when IC chip package 232 is positioned in socket 726. A greater thermally conductive contact area in these localized areas (spot cooling) aids in removing heat transferred from secondary cooling system 230 to socket 726 and assists in preventing high heat densities from developing. In other embodiments, in accordance with the invention, evaporator line 724 can take different shapes dependent upon heat dissipation patterns of IC chip package 232 and/or secondary cooling system 230.

As described above, and unlike the prior art, a refrigeration cooling assisted MEMS-based micro-channel cooling system in accordance with the invention, removes high heat densities by direct spot-cooling of microelectronic components while maintaining low levels of energy consumption with acceptable component sizes. In one embodiment, the refrigeration cooling assisted MEMS-based micro-channel cooling system includes a primary cooling system, at least one integrated circuit (IC) chip embedded secondary cooling system, and at least one socket for transferring heat dissipated by the IC chip embedded secondary cooling system to the primary cooling system.

By continually, or intermittently, removing heat transferred from the secondary cooling system through the socket to the primary cooling system, the thermal inertia and heat rejection areas experienced in the prior art MEMS-based cooling systems are significantly reduced allowing for higher heat dissipation levels.

The foregoing description of implementations of the invention have been presented for purposes of illustration and description only, and, therefore, are not exhaustive and do not limit the invention to the precise forms disclosed. Modifications and variations are possible in light of the above teachings or can be acquired from practicing the invention. Consequently, Applicants do not wish to be limited to the specific embodiments shown for illustrative purposes.

What is claimed is:

1. A refrigeration cooling assisted MEMS-based micro-channel cooling system comprising:
   a primary cooling system;
   at least one secondary cooling system; and
   at least one socket positioned in thermally conductive contact with at least a portion of the primary cooling system and at least a portion of the at least one secondary cooling system.

2. The refrigeration cooling assisted MEMS-based micro-channel cooling system of claim 1,
   wherein the secondary cooling system is embedded in an integrated circuit package including at least one integrated circuit, the at least one integrated circuit in thermally conductive contact with the secondary cooling system.

3. The refrigeration cooling assisted MEMS-based micro-channel cooling system of claim 2, wherein the secondary cooling system is a MEMS-based micro-channel cooling system.

4. The refrigeration cooling assisted MEMS-based micro-channel cooling system of claim 1, wherein the primary cooling system comprises:
   a refrigerant;
   at least one compressor;
   a condenser;
   an expansion device; and
   at least one evaporator; wherein,
      the at least one compressor, the condenser, the expansion device, and the at least one evaporator are coupled together in a refrigeration loop and the refrigerant is contained within the refrigeration loop.

5. The refrigeration cooling assisted MEMS-based micro-channel cooling system of claim 4, wherein at least a portion of the evaporator is positioned in thermally conductive contact with the socket.

6. The refrigeration cooling assisted MEMS-based micro-channel cooling system of claim 5, wherein the at least a portion of the evaporator is positioned in thermally conductive contact beneath the socket.

7. The refrigeration cooling assisted MEMS-based micro-channel cooling system of claim 5, wherein the at least a portion of the evaporator is positioned in thermally conductive contact within the socket.

8. The refrigeration cooling assisted MEMS-based micro-channel cooling system of claim 1, wherein the primary cooling system is a multiple compressor refrigeration heat sink module.

9. The refrigeration cooling assisted MEMS-based micro-channel cooling system of claim 1, wherein the socket is formed of a thermally conductive material.

10. The refrigeration cooling assisted MEMS-based micro-channel cooling system of claim 1, wherein the socket is formed of more than one thermally conductive material.

11. A primary cooling system module comprising:
    a printed circuit board;
    a primary cooling system affixed to the printed circuit board, the primary cooling system including at least one evaporator line; and
    at least one socket in thermally conductive contact with the at least one evaporator line, the at least one socket being affixed to the printed circuit board,
    wherein the at least one socket is formed of a thermally conductive material.

12. The primary cooling system module of claim 11, wherein the primary cooling system is a multiple compressor refrigeration heat sink module.

13. A primary cooling system module comprising:
    a printed circuit board; and
    a primary cooling system affixed to the printed circuit board, the primary cooling system including at least one evaporator line, the evaporator line for providing thermally conductive contact with at least one socket formed of a thermally conductive material,
    wherein the at least one evaporator line is arranged to increase the transfer of heat from selected areas of an integrated circuit package to be positioned within the at least one socket.

14. The primary cooling system module of claim 13, further comprising;
    at least one socket in thermally conductive contact with the at least one evaporator line, the at least one socket being affixed to the printed circuit board.

15. The primary cooling system module of claim 13, wherein the primary cooling system is a multiple compressor refrigeration heat sink module.

16. The primary cooling system module of claim 13, wherein the at least one evaporator line is arranged to increase the transfer of heat from selected areas of a secondary cooling system in an integrated circuit package to be positioned within the socket.

17. A method for dissipating heat generated by an integrated circuit, the method comprising:
    dissipating heat from an integrated circuit to a secondary cooling system, wherein at least a portion of the secondary cooling system is positioned in thermally conductive contact with at least a portion of a thermally conductive socket;
    dissipating at least a portion of the heat from the secondary cooling system to the thermally conductive socket, wherein the thermally conductive socket is further positioned in thermally conductive contact with at least a portion of a primary cooling system;
    dissipating at least a portion of the heat from the thermally conductive socket to the primary cooling system; and
    dissipating at least a portion of the heat from the primary cooling system.

18. The method of claim 17, wherein the secondary cooling system is a MEMS-based micro-channel cooling system embedded with the integrated circuit in an integrated circuit package.

19. The method of claim 17, wherein the primary cooling system is a multiple compressor refrigeration heat sink module.

20. A method for dissipating heat from an IC chip embedded secondary cooling system, the method comprising:
    positioning an IC chip embedded secondary cooling system in thermally conductive contact with a socket, the socket being thermally conductive;
    dissipating heat from the IC chip embedded secondary cooling system to the socket;
    positioning at least a portion of a primary cooling system in thermally conductive contact with the socket;
    transferring the heat dissipated to the socket to the at least a portion of the primary cooling system; and
    removing the transferred heat away from the socket by the primary cooling system.

21. The method of claim 20, wherein removing the transferred heat away from the socket by the primary cooling system is intermittent.

22. The method of claim 20, wherein removing the transferred heat away from the socket by the primary cooling system is continuous.

23. A refrigeration cooling assisted MEMS-based microchannel cooling system comprising:
- a primary cooling system;
- at least one secondary cooling system; and
- at least one socket thermally coupling at least a portion of the primary cooling system and at least a portion of the at least one secondary cooling system,
- wherein the socket is formed of a thermally conductive material.

24. A refrigeration cooling assisted MEMS-based microchannel cooling system comprising:
- a primary cooling system;
- at least one MEMS-based secondary cooling system; and
- at least one socket thermally coupling at least a portion of the primary cooling system and at least a portion of the at least one MEMS-based secondary cooling system,
- wherein the socket is formed of a thermally conductive material.

* * * * *